(12) United States Patent
Wu et al.

(10) Patent No.: US 12,120,843 B2
(45) Date of Patent: Oct. 15, 2024

(54) FAN MANAGEMENT SYSTEM AND METHOD

(71) Applicant: Delta Electronics, Inc., Taoyuan (TW)

(72) Inventors: Chia-Feng Wu, Taoyuan (TW);
Chien-Sheng Lin, Taoyuan (TW);
Ming-Lung Liu, Taoyuan (TW);
Hsin-Ming Hsu, Taoyuan (TW);
Yun-Hua Chao, Taoyuan (TW);
Po-Tsun Chen, Taoyuan (TW);
Yueh-Lung Huang, Taoyuan (TW);
Jung-Yuan Chen, Taoyuan (TW);
Yu-Cheng Lin, Taoyuan (TW)

(73) Assignee: Delta Electronics, Inc., Taoyuan (TW)

(*) Notice: Subject to any disclaimer, the term of this patent is extended or adjusted under 35 U.S.C. 154(b) by 474 days.

(21) Appl. No.: 17/474,878

(22) Filed: Sep. 14, 2021

(65) Prior Publication Data

US 2022/0087060 A1    Mar. 17, 2022

(30) Foreign Application Priority Data

Sep. 16, 2020   (CN) .......................... 202010972263.4
Aug. 26, 2021   (CN) .......................... 202110987178.X

(51) Int. Cl.
*G05B 6/02*      (2006.01)
*H05K 7/20*      (2006.01)

(52) U.S. Cl.
CPC ........... *H05K 7/20209* (2013.01); *G05B 6/02* (2013.01); *H05K 7/20172* (2013.01)

(58) Field of Classification Search
CPC ........................................................ G05B 6/02

USPC .......................................................... 700/282
See application file for complete search history.

(56) References Cited

U.S. PATENT DOCUMENTS

| | | | |
|---|---|---|---|
| 2005/0160323 A1* | 7/2005 | Wu ..................... | G06F 11/0751 714/E11.154 |
| 2009/0061756 A1* | 3/2009 | Germagian ........ | H05K 7/20836 454/184 |
| 2009/0190625 A1* | 7/2009 | Chung .................... | G06F 1/206 415/118 |
| 2015/0039177 A1* | 2/2015 | Chapman ............... | G07C 5/085 701/31.7 |
| 2019/0321832 A1* | 10/2019 | Oh ......................... | B01D 46/12 |
| 2022/0050796 A1* | 2/2022 | Wu ......................... | G06F 13/20 |

FOREIGN PATENT DOCUMENTS

| | | | |
|---|---|---|---|
| CN | 108119385 A | * | 6/2018 |
| CN | 111810432 A | | 10/2020 |
| JP | 2003346251 A | * | 12/2003 |

(Continued)

*Primary Examiner* — Jigneshkumar C Patel
(74) *Attorney, Agent, or Firm* — KIRTON McCONKIE; Evan R. Witt

(57) ABSTRACT

A fan management system includes a fan and a server. The fan includes a driving circuit, and the driving circuit is configured for driving the fan. The fan operates in an operation mode. The server is connected to the fan and is configured for controlling the operation of the fan. The driving circuit outputs a digital label signal when the fan operates abnormally, and the server obtains a production history, an operation information and a warning message of the fan through the digital label signal. The server adjusts the operation mode of the fan according to the warning message simultaneously.

18 Claims, 20 Drawing Sheets

(56) References Cited

FOREIGN PATENT DOCUMENTS

| | | |
|---|---|---|
| JP | 2009043071 A | 2/2009 |
| TW | I416013 B | 11/2013 |
| TW | I509396 B | 11/2015 |
| TW | I550193 B | 9/2016 |
| TW | M554949 U | 2/2018 |
| TW | M577070 U | 4/2019 |
| TW | I667616 B | 8/2019 |

* cited by examiner

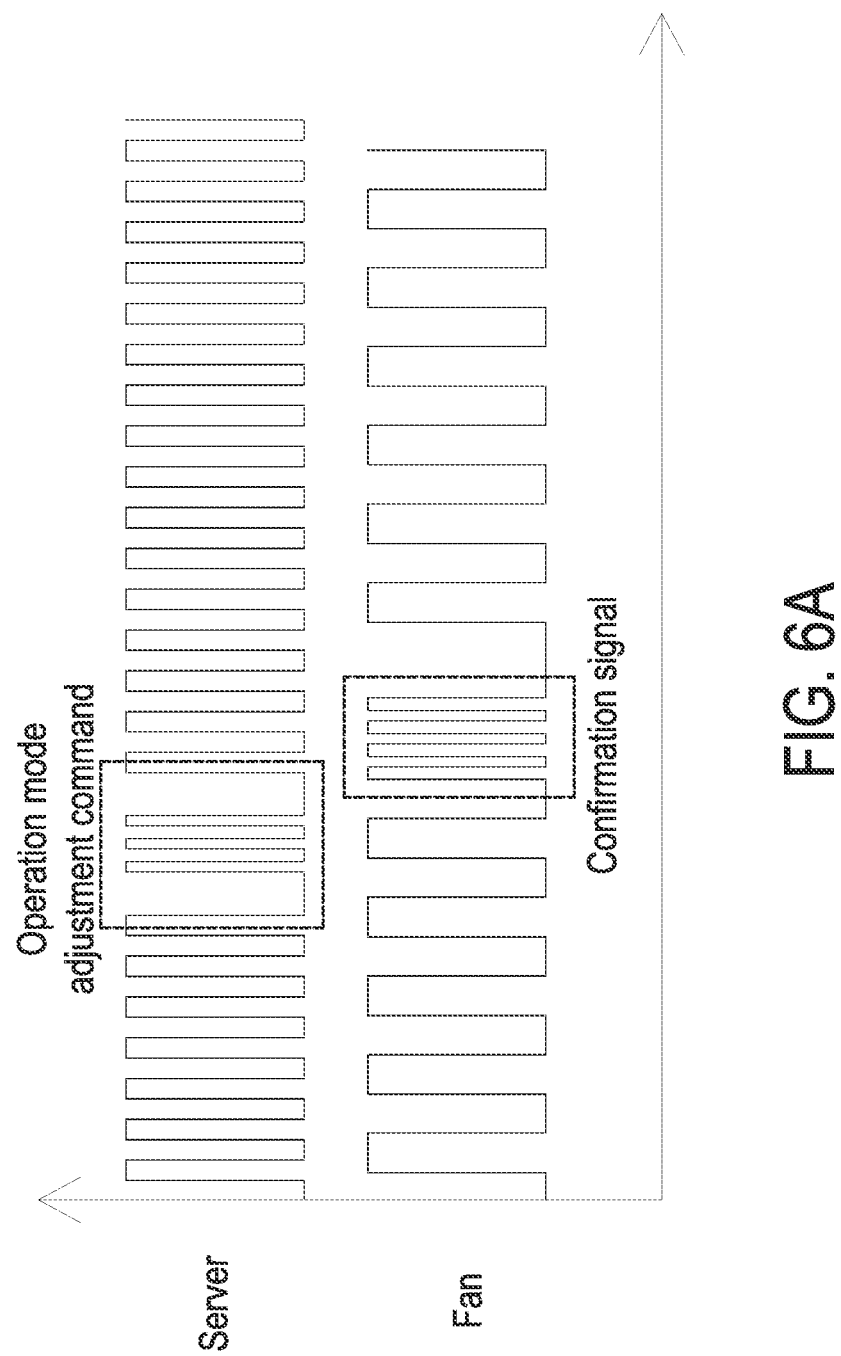

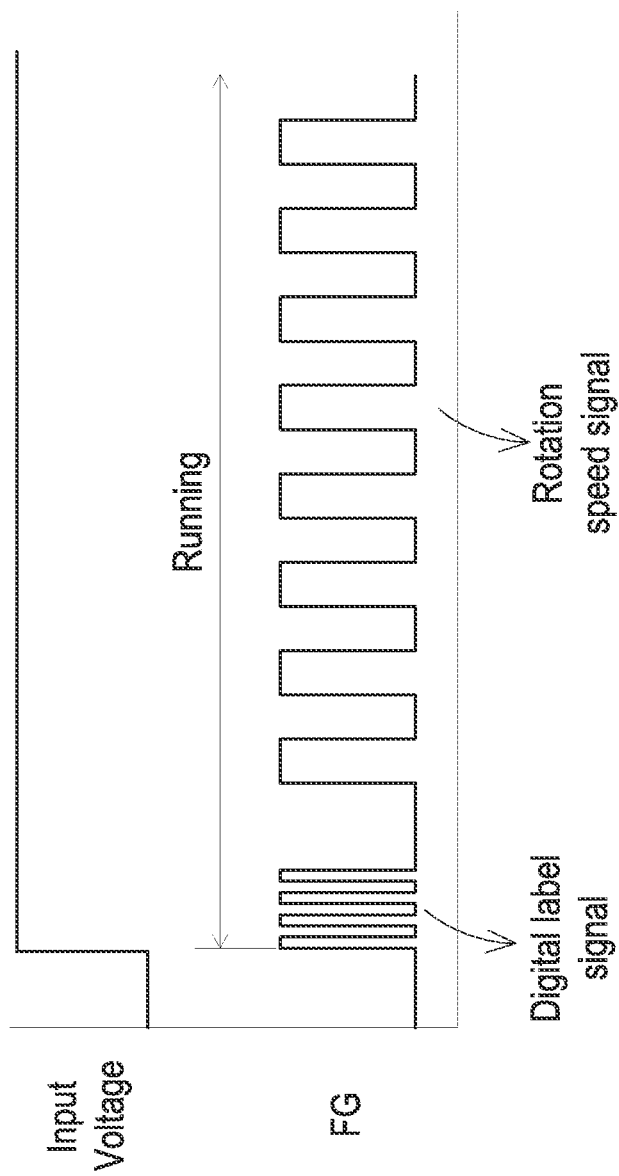

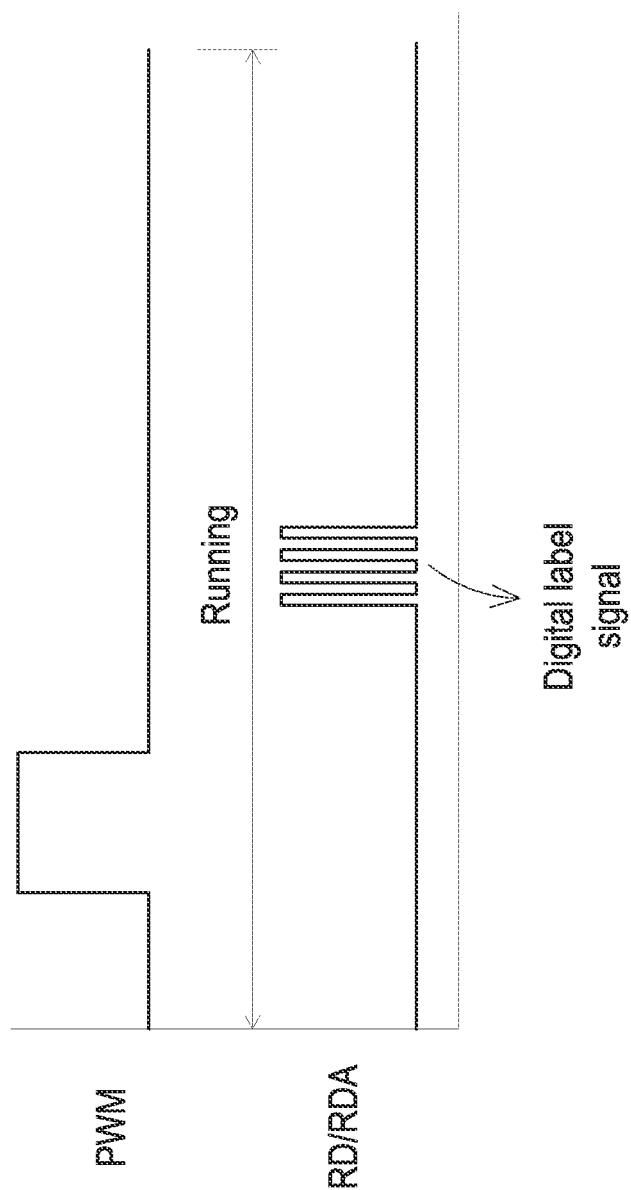

FAN MANAGEMENT SYSTEM AND METHOD

CROSS-REFERENCE TO RELATED APPLICATION

This application claims priorities to China Patent Application No. 202010972263.4 filed on Sep. 16, 2020 and China Patent Application No. 202110987178.X filed on Aug. 26, 2021, the entire contents of which are incorporated herein by reference for all purposes.

FIELD OF THE INVENTION

The present disclosure relates to a fan management system and method, and more particularly to a fan management system and method capable of outputting digital label signal with warning message.

BACKGROUND OF THE INVENTION

The conventional fan sends a rotation speed signal to the system when the fan is operating, so that the system can confirm whether the fan is operating within a predetermined rotation speed range.

However, the application of electronic equipment has higher temperature requirements in recent years, such as 5G high-frequency transmission and AI edge computing. These applications have stricter requirements on the cooling effect and stability of the fan and the power consumption of the fan. Therefore, the fan is required to provide the current operating conditions more immediately to actively confirm whether the heat dissipation system is working abnormally, thereby improving the reliability and performance of the electronic equipment. However, the conventional system or electronic equipment cannot fully know the real-time fan operation status only by the received rotation speed signal, and cannot improve the current fan operation condition.

Therefore, there is a need of providing a fan management system and method to obviate the drawbacks encountered from the prior arts.

SUMMARY OF THE INVENTION

It is an object of the present disclosure to provide a fan management system and method. When the fan operates abnormally, the digital label signal is output to the server through the pin of the driving circuit of the fan. The digital label signal includes the production history, the operation information and the warning message of the fan. Therefore, the present disclosure can report the information fan information to the server in real-time. In addition, the warning message of the digital label signal provides relevant warning information, whereby the server switches the corresponding operation mode according to the warning message to protect the fan and increase the life of the fan.

In accordance with an aspect of the present disclosure, there is provided a fan management system. The fan management system includes a fan and a server. The fan includes a driving circuit, and the driving circuit is configured for driving the fan. The fan operates in an operation mode. The server is connected to the fan and is configured for controlling the operation of the fan. The driving circuit outputs a digital label signal when the fan operates abnormally, and the server obtains a production history, an operation information and a warning message of the fan through the digital label signal. The server adjusts the operation mode of the fan according to the warning message.

In accordance with another aspect of the present disclosure, there is provided a fan management method. The fan management method includes steps of: (a) providing a fan and a server, wherein the fan includes a driving circuit and the fan operates in an operation mode; (b) determining if the fan operates normally, performing step (b) again if the determining result is satisfied, and performing step (c) if the determining result is not satisfied; (c) utilizing the driving circuit to output a digital label signal so that the server obtains a production history, an operation information and a warning message of the fan when the fan operates abnormally, and (d) adjusting the operation mode of the fan according to the warning message.

The above contents of the present invention will become more readily apparent to those ordinarily skilled in the art after reviewing the following detailed description and accompanying drawings, in which:

BRIEF DESCRIPTION OF THE DRAWINGS

FIGS. 6A-6C are waveform diagrams between the server and the fan of FIG. 3;

FIG. 8A is a schematic waveform diagram of a frequency generation pin FG of the driving circuit of FIG. 1 when the fan operates normally, and the frequency generation pin FG outputs the digital label signal;

FIG. 9B is a schematic waveform diagram of a rotation detection pin RD or a rotation detection alarm pin RDA of the driving circuit of FIG. 1 when the server instructs the driving circuit to provide the digital label signal, and the rotation detection pin RD or the rotation detection alarm pin RDA outputs the digital label signal;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
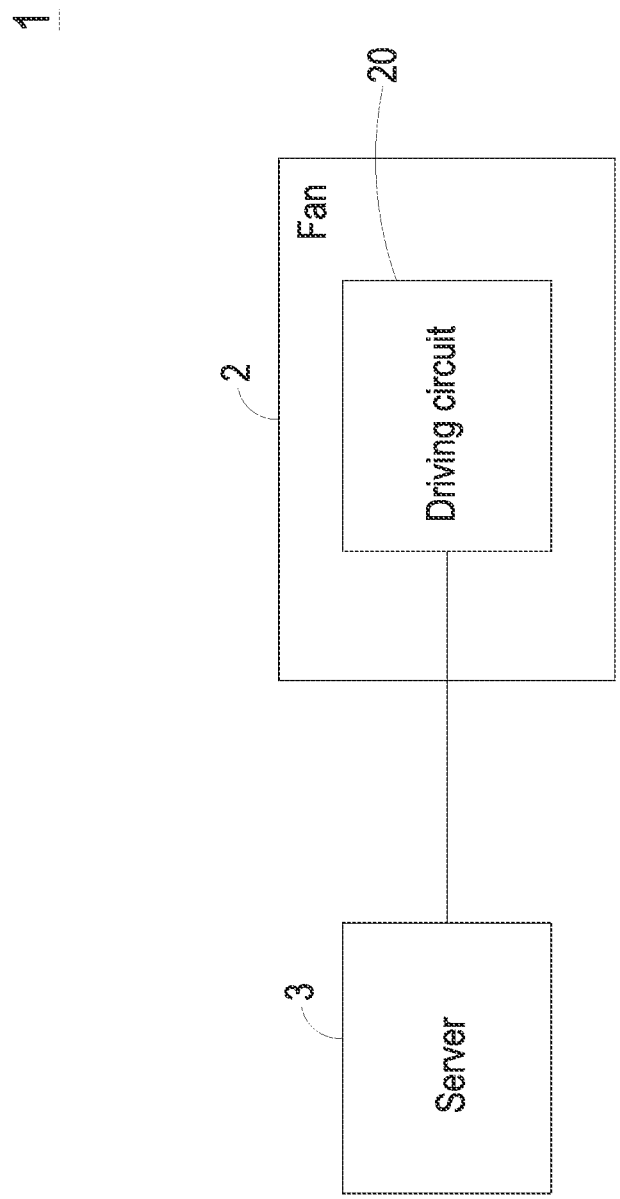
FIG. 1 is a schematic block diagram illustrating a fan management system according to an embodiment of the present disclosure.

FIG. 1 is a schematic block diagram illustrating a fan management system according to an embodiment of the present disclosure. As shown in FIG. 1, a fan management system 1 includes a fan 2 and a server 3. The fan 2 includes a driving circuit 20, and the driving circuit 20 is configured for driving the fan 2. The fan 2 operates in an operation mode. The server 3 is connected to the fan 2 and includes a processing unit (not shown), and the server 3 is configured for controlling the operation of the fan 2. The processing unit can transmit signals to the fan 2 or receive signals transmitted from the fan 2. The driving circuit 20 outputs a digital label signal when the fan 2 operates abnormally, and the server 3 obtains a production history, an operation information and a warning message of the fan 2 through the digital label signal. The server 3 adjusts the operation mode of the fan 2 according to the warning message. In an embodiment, the production history includes at least one of a production date, a production location, a production line information, a supplier, a supplier production number, a customer production number and a fan version of the fan 2. The operation information includes at least one of a voltage, a current, a rotation speed, a temperature, an operation time, a residual life and an error code of the fan 2. The error code of the operation information includes at least one of the over voltage, the low voltage, over current, low current, over power, low power and over temperature. In an embodiment, the warning message of the fan 2 includes the life evaluation to the fan 2. The life evaluation includes at least one of the voltage usage time to the fan 2, the real-time voltage and current value of the fan 2, the temperature detection to the fan 2, and the dust and foreign object detection to fan 2. In an embodiment, the driving circuit 20 is a motor drive chip with a memory, and the memory of the motor drive chip stores the production history, the operation information and the warning message of the fan. By outputting the digital label signal to the server 3 when the fan 2 operates abnormally, the fan information can be reported in real time. In addition, the warning message of the digital label signal provides relevant warning information, whereby the server 3 switches the corresponding operation mode according to the warning message to protect the fan 2 and increase the life of the fan 2.

In the present disclosure, it is noted that the normal operation of the fan 2 represents that the fan 2 operates under the rotation speed, rotation direction and rotation duration within a predetermined range. Conversely, the abnormal operation of the fan 2 represents that the fan 2 stops operating or operates under the rotation speed, rotation direction and rotation duration outside the predetermined range. In addition, when the fan 2 operates abnormally, the fan 2 can be restarted to try to resume normal operation. Specifically, restarting the fan 2 is to power off the fan 2 and re-input the voltage to the driving circuit 20.

The driving circuit 20 has a frequency generation pin FG, a rotation detection pin RD or a rotation detection alarm pin RDA. The following explains the signal output principle of the above three pins without outputting digital label signal. The frequency generation pin FG outputs a rotation speed signal during the rotation of the fan 2. The server 3 obtains the current operation status of the fan 2 through the rotation speed signal. When the fan 2 operates abnormally, the frequency generation pin FG stops outputting the rotation speed signal. The rotation detection pin RD and the rotation detection alarm pin RDA output a rotation detection signal and a rotation detection alarm signal respectively when the fan 2 operates abnormally. When the fan 2 is restarted, the rotation detection pin RD stops outputting the rotation detection signal, and the rotation detection alarm pin RDA continuously outputs the rotation detection alarm signal. The rotation detection pin RD and the rotation detection alarm pin RDA stop outputting the rotation detection signal and the rotation detection alarm signal respectively when the fan 2 operates normally. The fan 2 achieves the purpose of alarming the server 3 and protecting the fan 2 through the above three pins.

One of the frequency generation pin FG, the rotation detection pin RD and the rotation detection alarm pin RDA is utilized to output the digital label signal to the server 3 when the fan 2 operates abnormally. The following FIGS. 2A, 2B, and 2C exemplify the output states of the three kinds of pins respectively. It is noted that in the waveform diagrams of the present disclosure, "Running" represents the interval where the fan 2 operates normally, "Error" represents the interval where the fan 2 operates abnormally, and "Restart" represents the interval where the fan 2 is restarted.

Figure 2A:
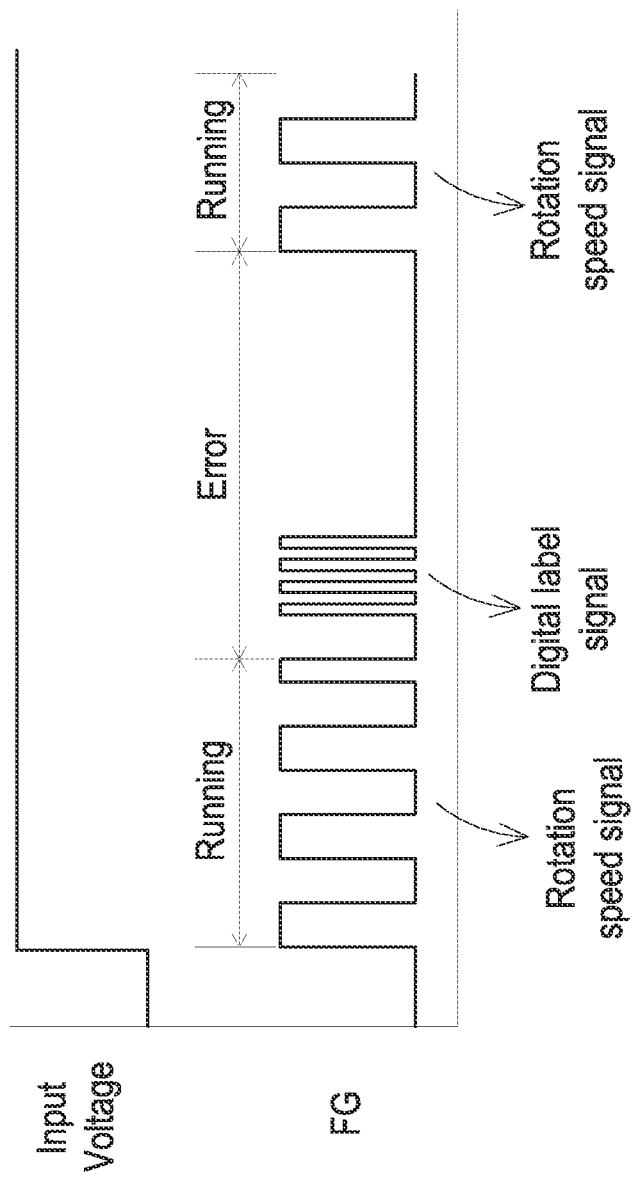
FIG. 2A is a schematic waveform diagram of a frequency generation pin FG of the driving circuit of FIG. 1 when the fan operates abnormally, and the frequency generation pin FG outputs the digital label signal.

As shown in FIG. 2A, the fan 2 utilizes the frequency generation pin FG to output the digital label signal. The frequency generation pin FG outputs the digital label signal when the fan 2 operates abnormally. The frequency generation pin FG continuously outputs the rotation speed signal when the fan 2 operates normally.

Figure 2B:
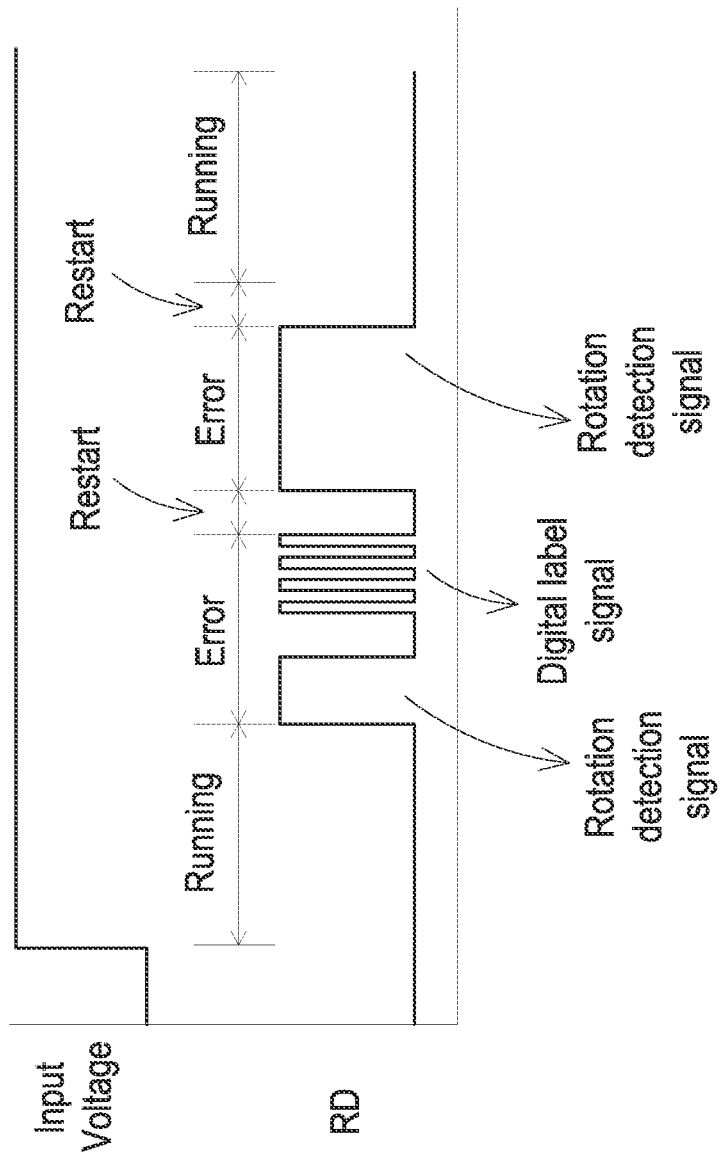
FIG. 2B is a schematic waveform diagram of a rotation detection pin RD of the driving circuit of FIG. 1 when the fan operates abnormally, and the rotation detection pin RD outputs the digital label signal.

As shown in FIG. 2B, the fan 2 utilizes the rotation detection pin RD to output the digital label signal. The rotation detection pin RD outputs the rotation detection signal and the digital label signal when the fan 2 operates abnormally. The rotation detection pin RD stops outputting the rotation detection signal and digital label signal when the fan 2 is restarted or operates normally.

Figure 2C:
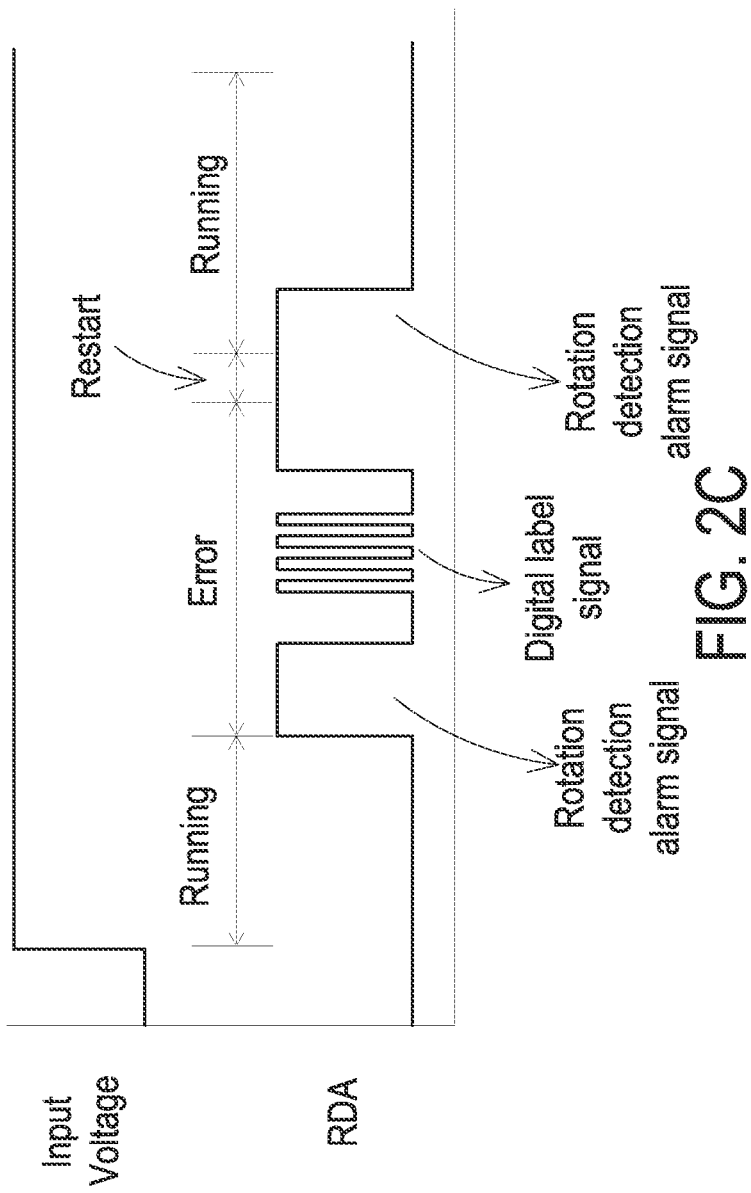
FIG. 2C is a schematic waveform diagram of a rotation detection alarm pin RDA of the driving circuit of FIG. 1 when the fan operates abnormally, and the rotation detection alarm pin RDA outputs the digital label signal.

As shown in FIG. 2C, the fan 2 utilizes the rotation detection alarm pin RDA to output the digital label signal. The rotation detection alarm pin RDA outputs the rotation detection alarm signal and the digital label signal when the fan 2 operates abnormally. The rotation detection alarm pin RDA stops outputting the digital label signal but continuously outputs the rotation detection alarm signal when the fan 2 is restarted. The rotation detection alarm pin RDA stops outputting the rotation detection alarm signal after the fan 2 operates normally for a period of time.

Figure 3:
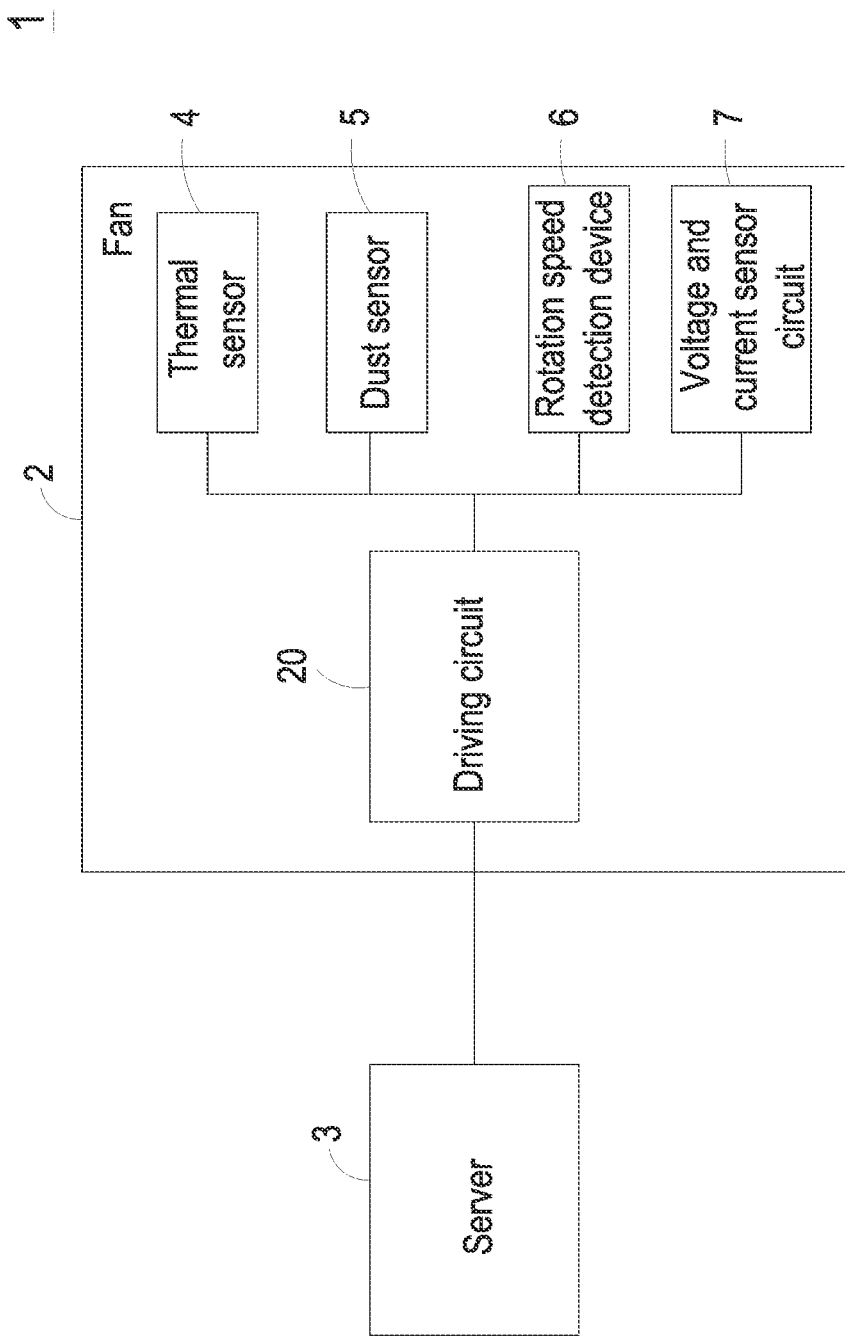
FIG. 3 is a schematic block diagram illustrating a fan management system according to another embodiment of the present disclosure.

FIG. 3 is a schematic block diagram illustrating a fan management system according to another embodiment of the present disclosure. As shown in FIG. 3, the fan 2 includes a driving circuit 20, a thermal sensor 4, a dust sensor 5, a rotation speed detection device 6, and a voltage and current sensor circuit 7. The diving circuit 20 includes a microprocessor (not shown). The microprocessor has a plurality of different preset range values, which are used to compare with the receive feedback signal output by each sensor to determine whether the fan 2 is operating abnormally, and the fan 2 sends the warning message to server 3 correspondingly. The thermal sensor 4 is configured for detecting the temperature of the fan 2 and outputting a temperature feedback signal to the microprocessor. When the microprocessor compares the received temperature feedback signal beyond the preset temperature sensing range value, the microprocessor sends a temperature warning message to the server 3 correspondingly. The dust sensor 5 (such as optical receiver) is configured for detecting whether there is dust or foreign object inside the fan 2. The dust sensor 5 outputs a dust feedback signal to the microprocessor when there exist dust or foreign object inside the fan 2. When the microprocessor compares the received dust feedback signal beyond the preset dust sensing range value, the microprocessor sends a dust and foreign object warning message to the server 3 correspondingly. The rotation speed detection device 6 is configured for detecting the rotation speed of the fan 2. The rotation speed detection device 6 outputs a rotational feedback signal to the microprocessor. When the microprocessor compares the received rotational feedback signal beyond the preset rotational sensing range value, the microprocessor sends a rotational warning message to the server 3 correspondingly. The voltage and current sensor circuit 7 is configured for detecting the real-time voltage-current value of the fan 2. The voltage and current sensor circuit 7 outputs a real-time voltage-current value to the microprocessor. When the microprocessor compares the received real-time voltage-current value beyond the preset rotational sensing range value, the microprocessor sends a voltage-current value warning message to the server 3 correspondingly. The on-site personnel can be provided to perform corresponding maintenance or overhaul operations based on the different abnormal warning messages sent by the microprocessor of the fan 2. Or the microprocessor inside the fan 2 can also adjust the operation mode of fan 2 in response to different abnormal warning messages. For example, when the dust feedback signal received by the fan 2 exceeds the preset dust sensing range value, the microprocessor can not only send a dust and foreign object warning message to the server 3, but also control the fan 2 at the same time to execute a reverse dust removal mode operation to remove dust inside the fan 2. It should be noted that the fan 2 of this embodiment can also be applied to the digital label signal transmission of the fan 2 described in FIGS. 2A-2C.

Figure 4A:
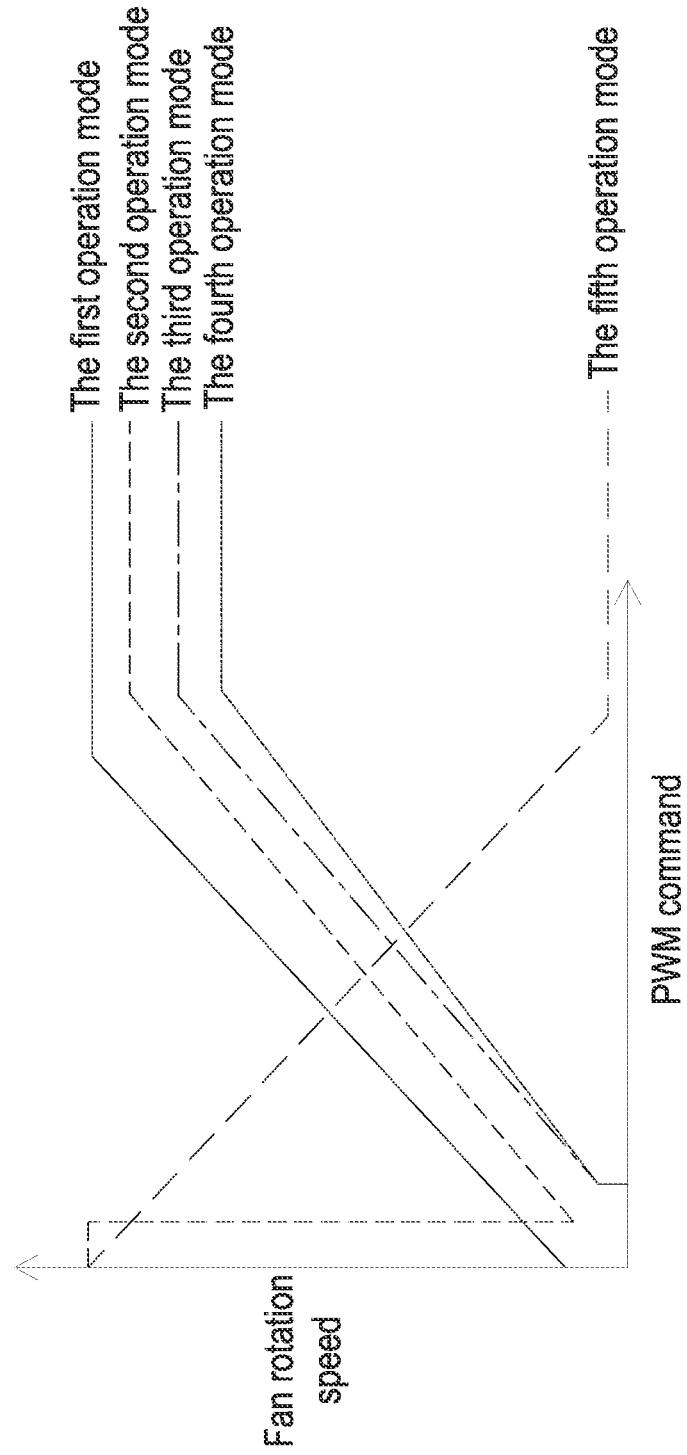
FIG. 4A is a schematic diagram showing the relationship between fan rotation speed when the fan in FIG. 3 operates in the first to fifth operation modes.
Figure 4B:
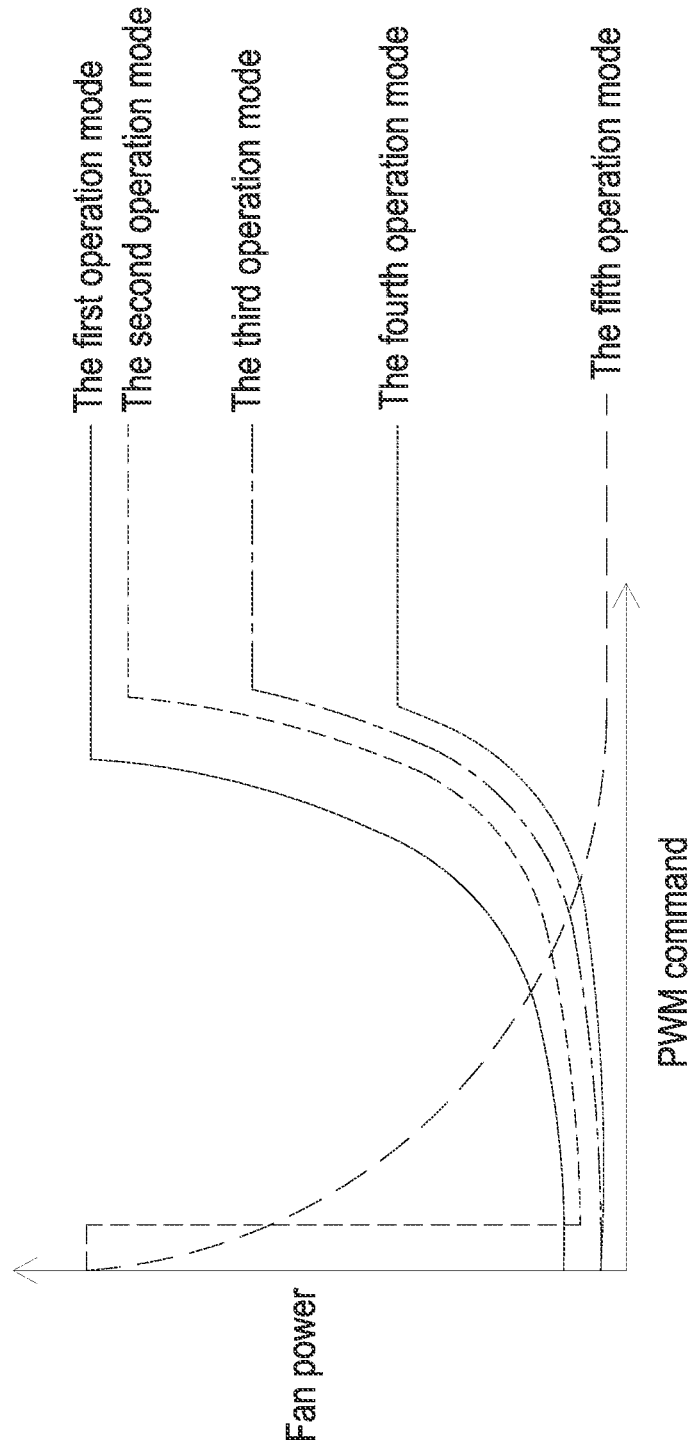
FIG. 4B is a schematic diagram showing the relationship between the fan power when the fan in FIG. 3 operates in the first to fifth operating modes.

The server 3 adjusts the operation mode of the fan 2 according to the warning message of the digital label signal. In an embodiment, the fan 2 includes a plurality of operation modes. Please refer to FIGS. 4A and 4B, FIG. 4A is a schematic diagram showing the relationship between fan rotation speed when the fan 2 in FIG. 3 operates in a first to fifth operation modes. FIG. 4B is a schematic diagram showing the relationship between the fan power when the fan 2 in FIG. 3 operates in the first to fifth operating modes. In this embodiment, the fan 2 has first to fifth operation modes, and the first to fifth operation modes have different fan rotation speed and fan powers under the same PWM command. The number of operation modes can be adjusted according to the actual needs and should not be limited thereto.

Figure 5:
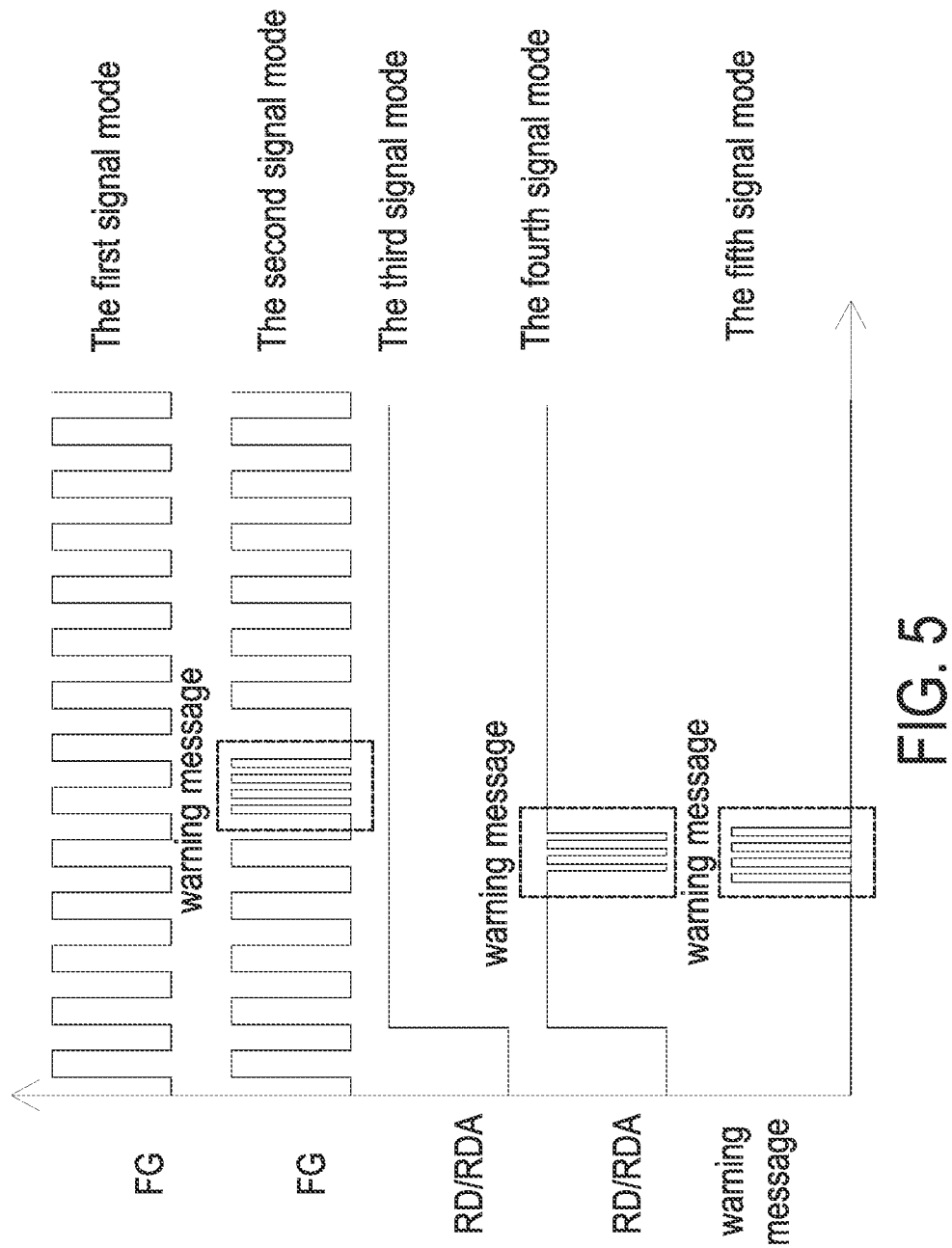
FIG. 5 is a waveform diagram of various signal modes of the fan of FIG. 3.

In some embodiments, the frequency generating pin FG of fan 2 not only outputs the rotation speed signal, but also outputs a warning message to the server 3 during the process of outputting the rotation speed signal. The rotation detection pin RD of fan 2 not only outputs the rotation detection signal, but also outputs a warning message to the server 3 during the process of outputting the rotation detection signal. The rotation detection alarm pin RDA of fan 2 not only outputs the rotation detection alarm signal, but also outputs a warning message to the server 3 during the process of outputting the rotation detection alarm signal. Please refer to FIG. 5 as an example to illustrate the output state of various signal modes. As shown in FIG. 5, the first signal mode to the fifth signal mode, the first signal mode represents that the fan 2 utilizes the frequency generating pin FG to output the rotation speed signal. The second signal mode represents that fan 2 utilizes the frequency generating pin FG to output rotation speed signal and warning message. The third signal mode represents that the fan 2 utilizes the rotation detection pin RD or the rotation detection alarm pin RDA to output the corresponding rotation detection signal or rotation detection alarm signal. The fourth signal mode represents that the fan 2 utilizes the rotation detection pin RD or the rotation detection alarm pin RDA to output the corresponding rotation detection signal or rotation detection alarm signal and the warning message. The fifth signal mode represents the signal of the warning message.

The present application is not limited to the server 3 switching the corresponding operation mode according to the warning message. In some embodiments, the server 3 can also actively input an operation mode adjustment command to the fan 2. The following example illustrates the signal transmission process between the fan 2 and the server 3 when the server 3 actively adjusts the operation mode of the fan 2.

Figure 6B:
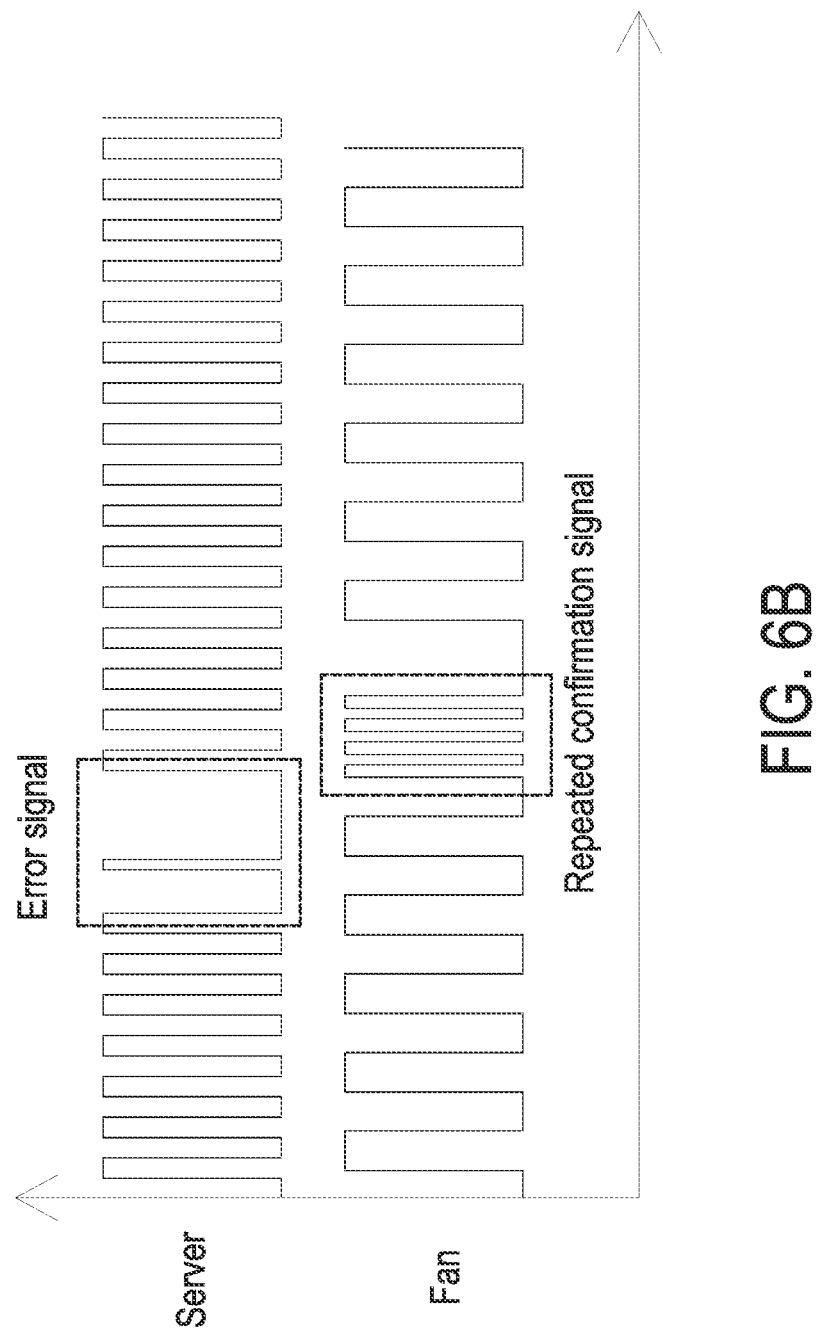
Figure 6C:
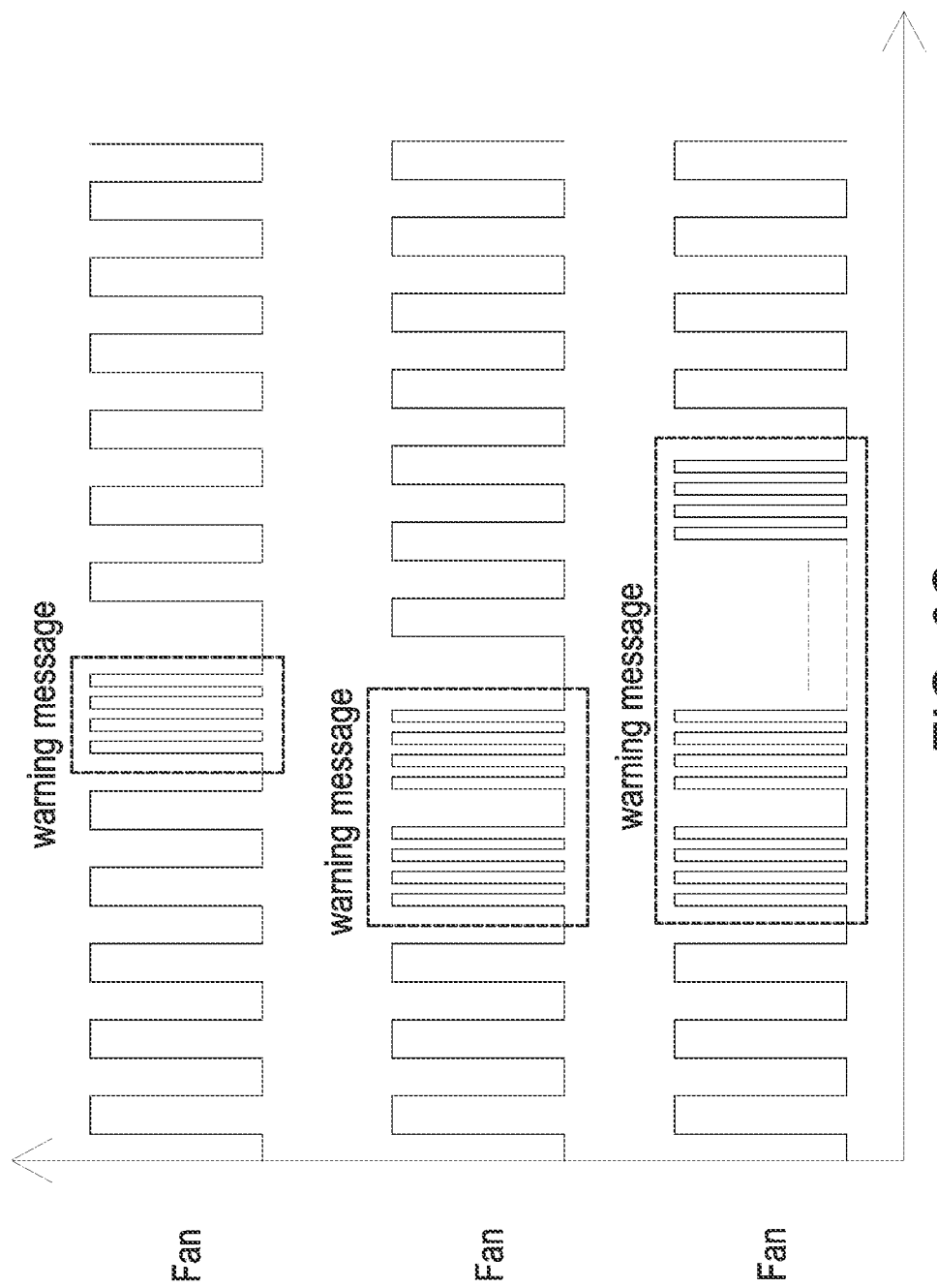

FIGS. 6A-6C are schematic diagrams of the signal waveforms between the server 3 and the fan 2 of FIG. 3. As shown in FIG. 6A, when the server 3 inputs an operation mode adjustment command to the fan 2 to control the fan 2 to operate in one of the first to fifth operation modes, the fan 2 outputs a confirmation signal to the server 3 to confirm receipt of the operating mode adjustment command and the fan 2 operates in the specified operating mode.

As shown in FIG. 6B, when the server 3 inputs an error signal to the fan 2, the fan 2 outputs a repeated confirmation signal to the server 3 to confirm the signal transmission of the server 3, and the fan 2 continues to operate without adjusting the current operating mode. The error signal is not a default operation mode adjustment command.

When the signal output by the fan 2 includes a warning message, the server 3 can adjust the operation mode of the fan 2 according to the warning message, or the user can perform maintenance on the fan 2 according to the warning message. For example, on-site maintenance of the fan 2, replacement of the fan 2, or removal of dust and foreign objects, etc. The warning message output by the fan 2 is shown in FIG. 6C. The signal output by the fan 2 may include one group of warning messages, two groups of warning messages, or multiple groups of warning messages.

There are two calculation methods for the life evaluation of fan 2 in the present application. One of the methods is to utilize a counter (not shown) of the fan 2 to record the voltage usage time of the fan 2. When the voltage usage time exceeds a preset time, the fan 2 generates a warning message. Another method is to utilize the temperature detection result of the fan 2 by the thermal sensor 4, the rotation speed detection result of the fan 2 by the rotation speed detection device 6, the Webber shape parameter, and the counter parameter to calculate the total residual life of the fan 2 as the life evaluation of the fan 2. The fan 2 generates a warning message when the total residual life of the fan is lower than a predetermined residual life. The calculation method of the Total Residual Life of the fan is shown as follows.

$$\text{Total Residual Life of the fan} = \frac{\text{Total Residual Running Value}}{T_S * N_{max}} \quad (1)$$

$T_S$ is the experimental temperature during the fan life test, and $N_{max}$ is the experimental rotation speed during the fan life test. The calculation method of the Total Residual Running Value is shown as follows.

Total Residual Running Value=(MCU Register Value)−(Total Running Value)  (2)

The calculation method of the MCU Register Value is shown as follows.

MCU Register Value=$T_S*N_{max}*L10$  (3)

L10 is the rated life of the fan. The calculation method of the Total Running Value is shown as follows.

$$\text{Total Running Value} = N * T_S * h * \left[ \frac{1}{F^{[(T_S - T_u)/10]}} \right] \quad (4)$$

N is the current speed of fan 2, h is the operating time of fan 2, F is the acceleration factor coefficient, and Tu is the current operating temperature of fan 2.

Figure 7:
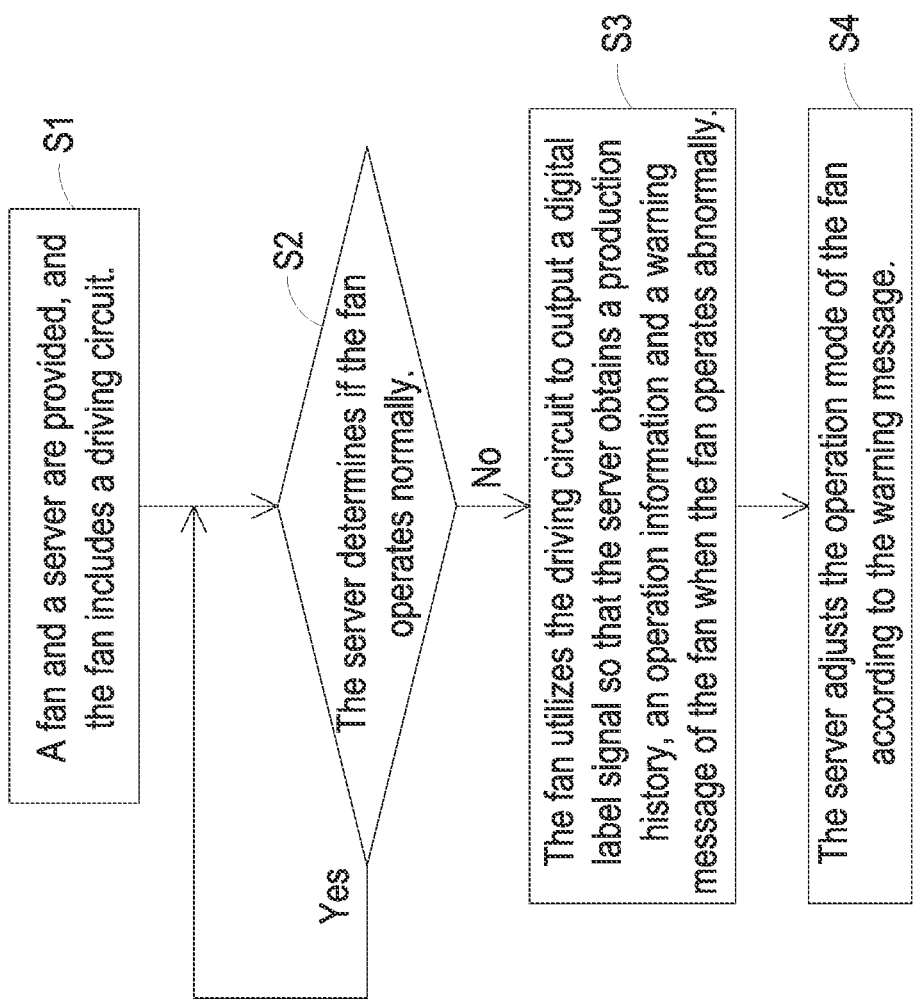
FIG. 7 is a flow chart illustrating a fan management method according to an embodiment of the present disclosure.

FIG. 7 is a flow chart illustrating a fan management method according to an embodiment of the present disclosure. The fan management method of the present disclosure is applicable to the fan management system 1 mentioned above. As shown in FIG. 7, the fan management method includes steps S1, S2, S3 and S4. In the step S1, a fan 2 and a server 3 are provided, and the fan 2 includes a driving circuit 20. The fan 2 operates in an operation mode. In the step S2, the server 3 determines if the fan 2 operates normally. The step S2 is performed again when the determination result is satisfied (i.e., the fan 2 operates normally), and the step S3 is performed when the determination result is not satisfied (i.e., the fan 2 operates abnormally). In the step S3, the fan 2 utilizes the driving circuit 20 to output a digital label signal so that the server 3 obtains a production history, an operation information and a warning message of the fan 2 when the fan 2 operates abnormally. In the step S4, the server 3 adjusts the operation mode of the fan 2 according to the warning message.

In an embodiment, in the step S3, the fan 2 utilizes a frequency generation pin FG to output the digital label signal. In addition, the fan management method further includes a step of: utilizing the frequency generation pin FG to output a rotation speed signal when the fan 2 operates normally.

In an embodiment, in the step S3, the fan 2 utilizes a rotation detection pin RD to output a rotation detection signal and the digital label signal. In addition, the fan management method further includes a step of: stopping outputting the rotation detection signal when the fan 2 is restarted.

In an embodiment, in the step S3, the fan 2 utilizes a rotation detection alarm pin RDA to output a rotation detection alarm signal and the digital label signal. In addition, the fan management method further includes a step of: outputting the rotation detection alarm signal continuously when the fan is restarted.

In the present disclosure, the digital label signal is not limited to be output when the fan 2 operates abnormally. In some embodiments, the pins of the driving circuit 20 can also output the digital label signal directly when the fan 2 is activated. The following FIGS. 8A and 8B are used to illustrate various implementations of outputting the digital label signal by the frequency generation pin FG, the rotation detection pin RD and the rotation detection alarm pin RDA, respectively.

Figure 8B:
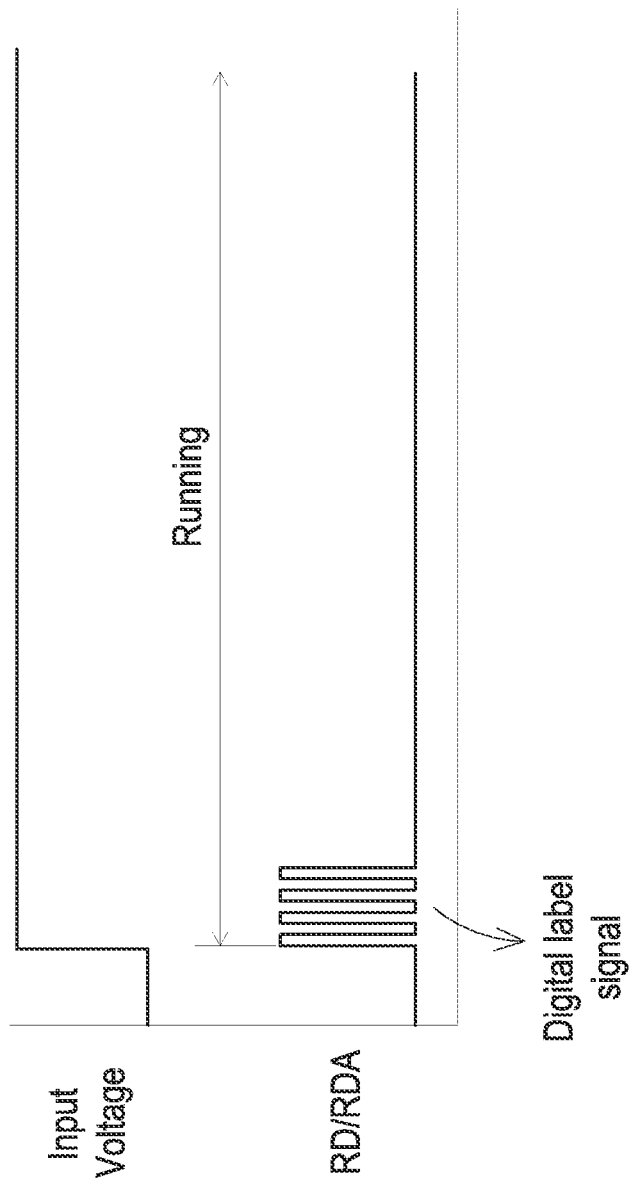
FIG. 8B is a schematic waveform diagram of a rotation detection pin RD or a rotation detection alarm pin RDA of the driving circuit of FIG. 1 when the fan operates normally, and the rotation detection pin RD or the rotation detection alarm pin RDA outputs the digital label signal.

As shown in FIG. 8A, the fan 2 utilizes the frequency generation pin FG to output the digital label signal. When the input voltage is switched from low-level voltage to high-level voltage, which represents that the fan 2 is activated, the frequency generation pin FG outputs the digital label signal immediately. Since the fan 2 operates normally, the frequency generation pin FG not only outputs the digital label signal but also outputs the rotation speed signal continuously. In FIG. 8A, the frequency generation pin FG continuously outputs the rotation speed signal after outputting the digital label signal, but the timing of outputting the digital label signal is not limited thereto. The frequency generation pin FG can also intersperse and output the digital label signal when outputting the rotation speed signal, that is, the digital label signal is output after the fan 2 starts operating normally for a predetermined period of time. As shown in FIG. 8B, the fan 2 utilizes the rotation detection pin RD or the rotation detection alarm pin RDA to output the digital label signal. When the input voltage is switched from low-level voltage to high-level voltage, which represents that the fan 2 is activated, the rotation detection pin RD or the rotation detection alarm pin RDA outputs the digital label signal immediately. Since the fan 2 does not operate abnormally, the rotation detection pin RD or the rotation detection alarm pin RDA does not output any signal except for the digital label signal. The rotation detection pin RD or the rotation detection alarm pin RDA can also output the digital label signal after the fan 2 operates normally for a predetermined period of time.

Figure 9A:
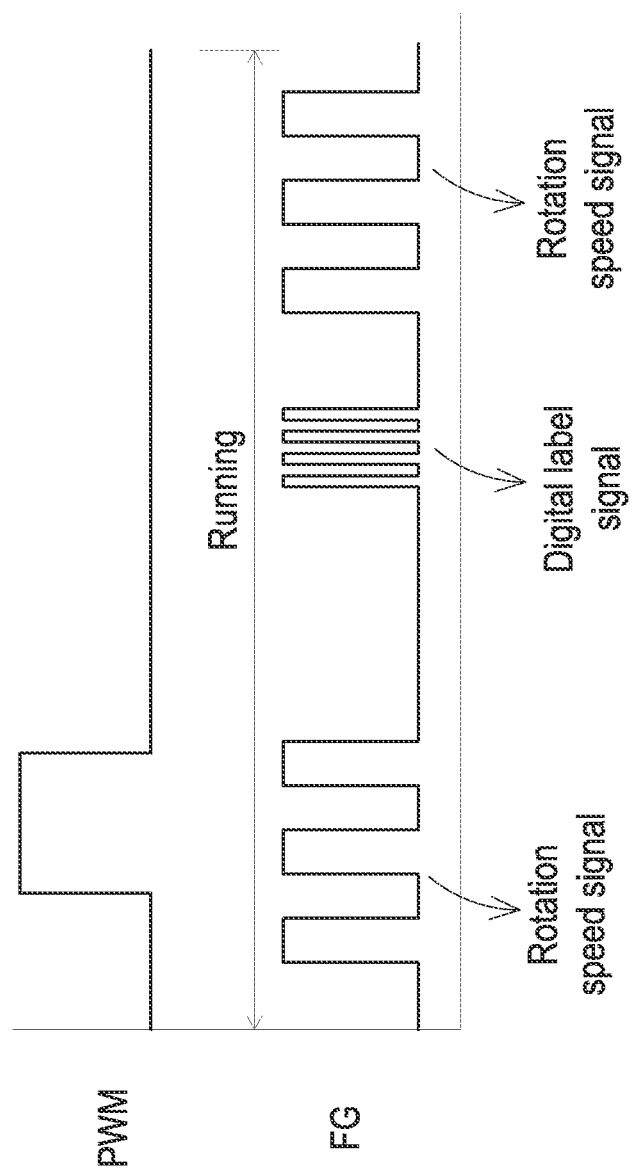
FIG. 9A is a schematic waveform diagram of a frequency generation pin FG of the driving circuit of FIG. 1 when the server instructs the driving circuit to provide the digital label signal, and the frequency generation pin FG outputs the digital label signal.

Furthermore, in the present disclosure, the digital label signal is not limited to be output when the fan 2 operates abnormally or when the fan 2 is activated. In fact, the server 3 can output a request signal to the fan 2 at any time for enabling the driving circuit 20 of the fan 2 to output the digital label signal to the server 3. FIGS. 9A and 9B are used as examples to illustrate that after the fan 2 receives the request signal output by the server 3, the driving circuit 20 of the fan 2 outputs the digital label signal through the frequency generation pin FG, the rotation detection pin RD and the rotation detection alarm pin RDA.

As shown in FIG. 9A, the fan 2 utilizes the frequency generation pin FG to output the digital label signal. When the server 3 outputs a specific pulse width modulation signal (hereinafter also referring to as PWM signal) to the driving circuit 20, which represents that the server 3 informs the fan 2 to output the digital label signal, the frequency generation pin FG outputs the digital label signal after a predetermined period of time. Since the fan 3 operates normally, in addition to outputting the digital label signal, the frequency generation pin FG continuously outputs the rotation speed signal. The frequency generation pin FG can also output the digital label signal immediately when the driving circuit 20 receives the specific PWM signal. As shown in FIG. 9B, the fan 2 utilizes the rotation detection pin RD or the rotation detection alarm pin RDA to output the digital label signal. When the server 3 outputs the specific PWM signal (i.e., the request signal of the server 3) to the driving circuit 20, which represents that the server 3 informs the fan 2 to output the digital label signal, the rotation detection pin RD or the rotation detection alarm pin RDA outputs the digital label signal within a predetermined period of time after the driving circuit 20 receives the specific PWM signal. Further, since the fan 2 does not operate abnormally, the rotation detection pin RD or the rotation detection alarm pin RDA does not output any signal other than the digital label signal. The rotation detection pin RD or the rotation detection alarm pin RDA can also output the digital label signal immediately once the driving circuit 20 receives the specific PWM signal.

Figure 10:
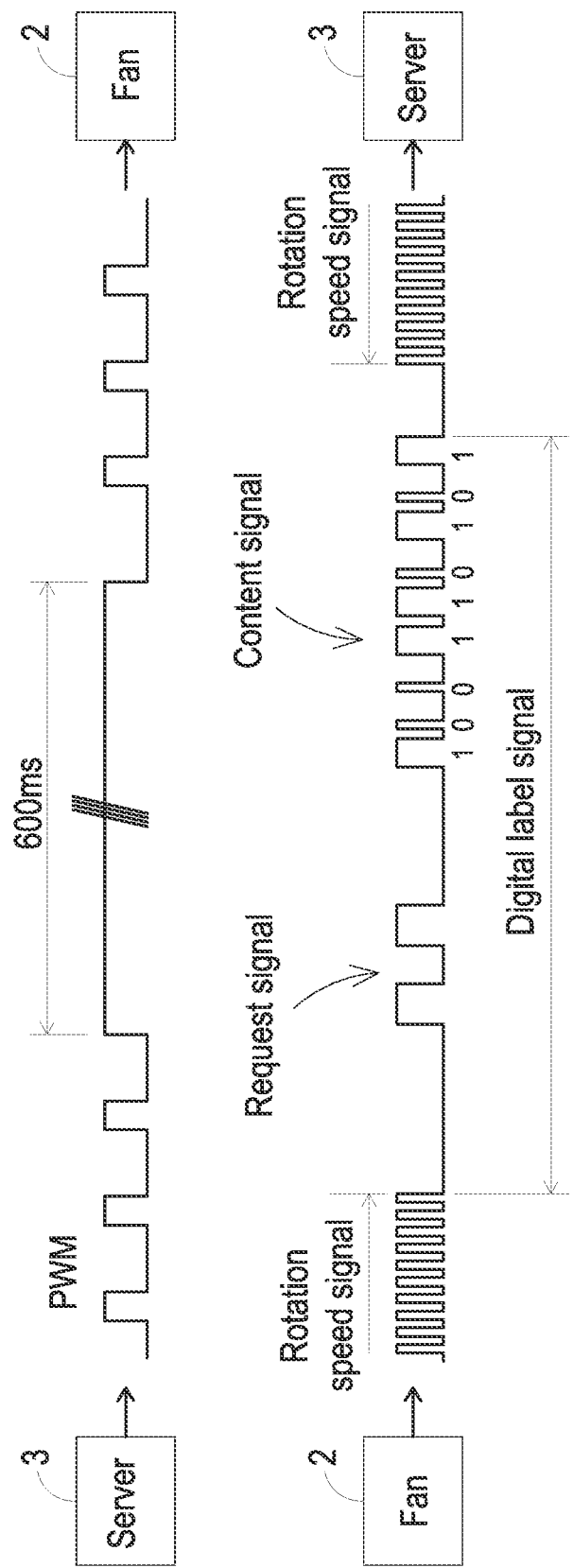
FIG. 10 is a schematic diagram illustrating the signal transmission between the server and the driving circuit when the server informs the driving circuit to output the digital label signal, and the frequency generation pin FG outputs the digital label signal.

The following practical examples illustrate the signal transmission between the server 3 and the driving circuit 20 when the server 3 notifies the driving circuit 20 of the fan 2 to output the digital label signal to the server 3, wherein the digital label signal is output by the frequency generation pin FG. As shown in FIG. 10, the server 3 outputs the specific PWM signal with specific duty cycle to the driving circuit 20 of the fan 2 in a specific continuous time. The specific PWM signal is for example but not limited to a 100% duty cycle square wave signal being continuously transmitted for 600 milliseconds. The specific PWM signal represents that the server 3 informs the fan 2 to output a digital label signal. The driving circuit 20 utilizes the frequency generation pin FG to output the digital label signal after receiving the specific PWM signal. The digital label signal includes a request signal and a content signal. The request signal represents that the driving circuit 20 informs the server 3 to be ready to transmit the content signal. The content signal is for example but not limited to a continuous waveform signal representing a binary string (where the continuous waveform signal has predefined specific ratios of the duty cycle for representing the logic "0" and the logic "1" respectively), and the total length of the content signal is 64 bytes. The content signal includes the production history and the operation information of the fan 2.

Figure 11:
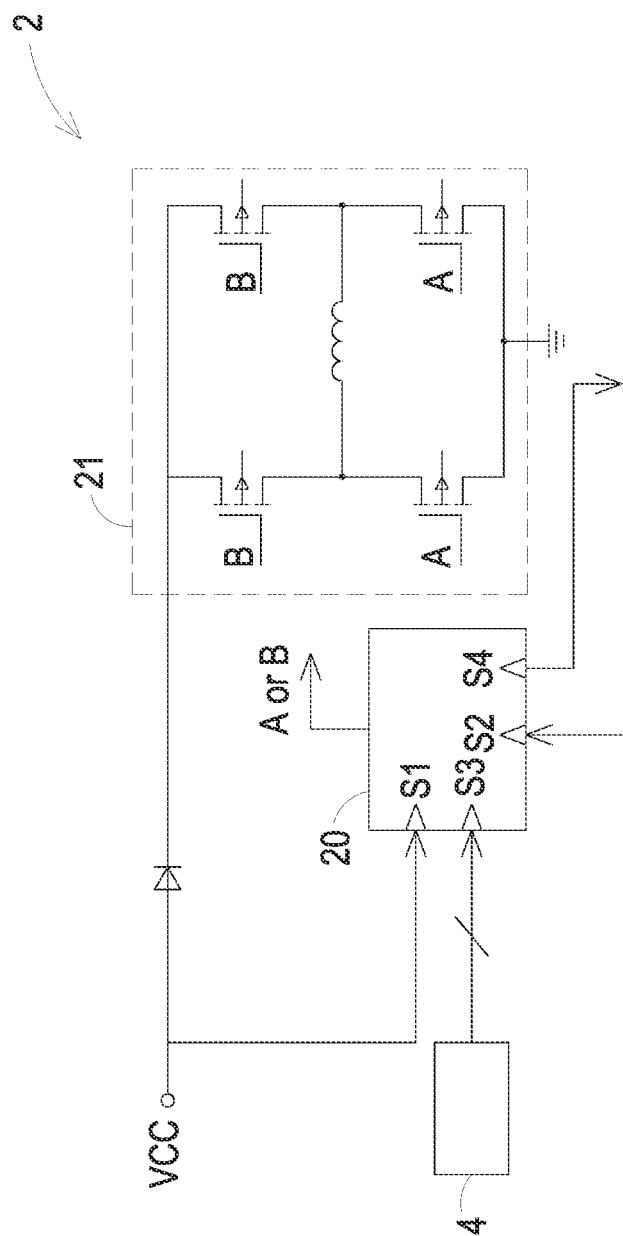
FIG. 11 is a schematic circuit diagram illustrating the fan of FIG. 1, and the fan has single-phase output.
Figure 12:
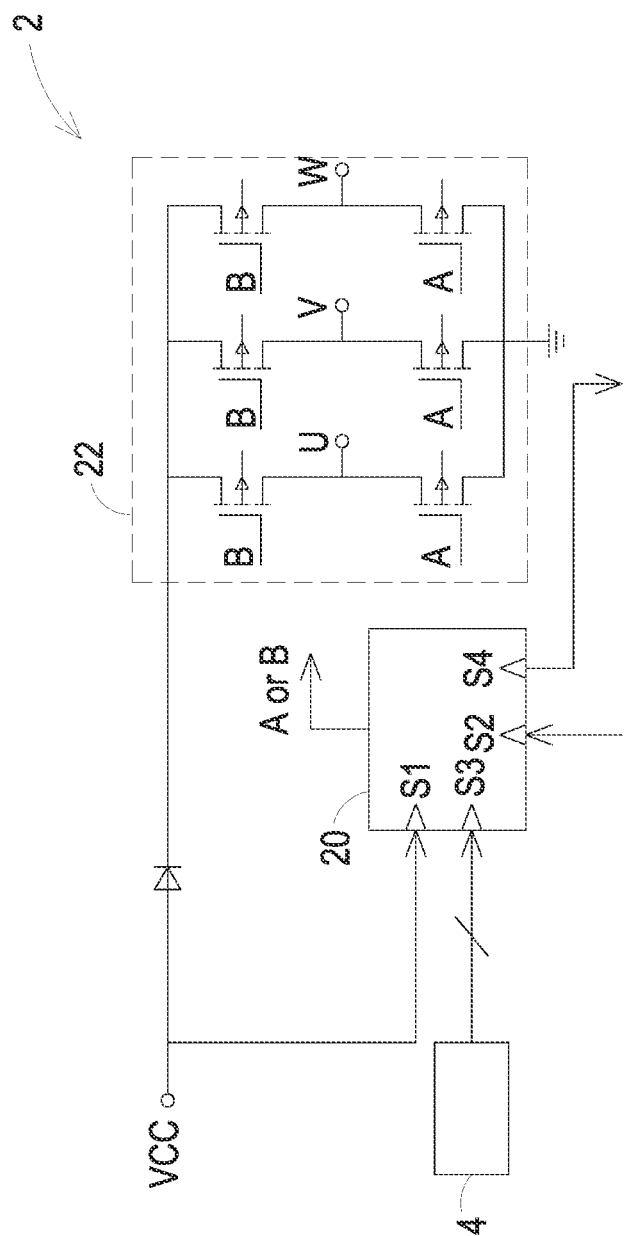
FIG. 12 is a schematic circuit diagram illustrating the fan of FIG. 1, and the fan has three-phase output.
Figure 13:
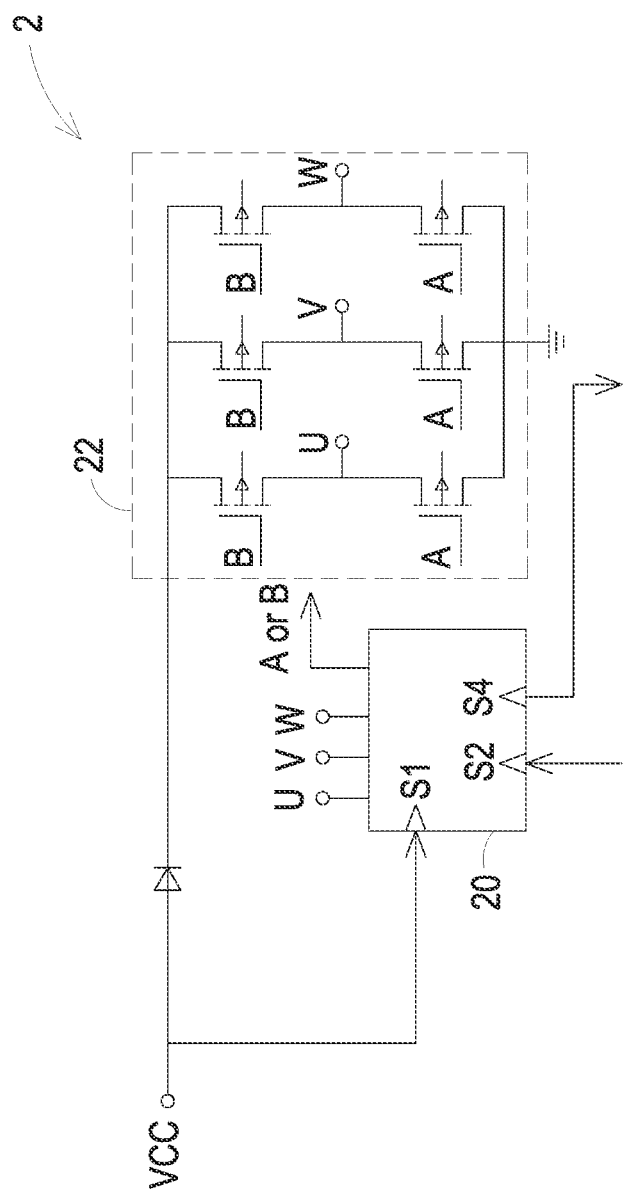
FIG. 13 is a schematic circuit diagram of a variation of the fan in FIG. 12.

The fan 2 of the present disclosure has a single-phase output or a three-phase output. FIG. 11 is a schematic circuit diagram illustrating the fan of FIG. 1, and the fan has a single-phase output. FIG. 12 is a schematic circuit diagram illustrating the fan of FIG. 1, and the fan has three-phase output. FIG. 13 is a schematic circuit diagram of a variation of the fan in FIG. 12. As shown in FIG. 11, the driving circuit 20 has pins S1, S2, S3 and S4. The pin S1 is electrically connected to the supply voltage VCC, and the supply voltage VCC is configured for supplying power to the driving circuit 20. The pin S2 is an input pin and is configured for receiving the specific PWM signal or other related commands to the fan 2. The pin S3 is electrically connected to a sensing element 4, and the sensing element 4 is configured for sensing the rotation speed and the rotation position of the fan 2. The sensing element 4 is for example but not limited to a Hall element. The pin S4 is an output pin, and the output pin is the frequency generation pin FG, the rotation detection pin RD or the rotation detection alarm pin RDA. The pin S4 is configured for outputting the digital label signal. The fan 2 includes a switching circuit 21. The switching circuit 21 includes two bridge arms connected in parallel, and each bridge arm includes a set of switches A and B connected in series. The driving circuit 20 determines that the driving circuit 20 is connected to the switch A or the switch B according to the sensing signal provided by the sensing element 4 connected to the pin S3, and the driving circuit 20 drives the fan 2 to rotate according to the determination result. FIG. 12 is a schematic circuit diagram illustrating the fan of FIG. 1, and the fan is three-phase output. The circuit elements of FIG. 12 that are similar with those of FIG. 11 are represented by the same reference numerals, and the detailed description thereof is omitted herein. However, compared to FIG. 11, the switching circuit 22 in FIG. 12 includes three bridge arms connected in parallel, and each bridge arm includes a set of switches A and B connected in series. FIG. 13 is a schematic circuit diagram of a variation of the fan in FIG. 12. The circuit elements of FIG. 13 that are similar with those of FIG. 12 are represented by the same reference numerals, and the detailed description thereof is omitted herein. However, compared to FIG. 12, the driving circuit 20 in FIG. 13 does not have pin S3, and the switches A and B in each bridge arm of the switching circuit 22 have nodes U, V, and W. The nodes U, V, and W form three-phase AC circuit, and the nodes U, V, and W are electrically connected to the driving circuit 20. The driving circuit 20 determines that the driving circuit 20 is connected to the switch A or the switch B according to the three-phase voltage or the three-phase current, so as to drive the fan 2 to rotate according to the determination result.

The digital label signal of the present disclosure includes the information of the fan 2. For example, as shown in Table 1, the digital label signal may include fan model, fan version, product serial number, supplier, production location, production line information, production date, fan voltage, fan current, fan power, fan rotation speed, error code of over voltage, error code of low voltage, error code of over current, error code of low current, error code of over power, error code of low power, error code of temperature, and error code of rotation speed abnormally. The actual state of the information contained in the digital label signal is not limited thereto and can be adjusted according to the practical requirements.

TABLE 1

Fan Model
Fan Version
Product Serial Number
Supplier
Production Location
Production Line Information
Production Date
Fan Voltage (Volt)
Fan Current (Ampere)
Fan Power (Watts)
Fan Rotation Speed (Rpm)
Residual Life (hour)
Temperature (degree Celsius)
Error code of Over Voltage (Volt)
Error code of Low Voltage (Volt)
Error code of Over Current (Ampere)
Error code of Low Current (Ampere)
Error code of Over Power (watts)
Error code of Low Power (watts)
Error code-Temperature
Error code-Rotation Speed Abnormally From the above descriptions, the present disclosure provides a fan management system and method. When the fan operates abnormally, the digital label signal is output to the server through the pin of the driving circuit of the fan. The digital label signal includes the production history, the operation information and the warning message of the fan.

Therefore, the present disclosure can report the information fan information to the server in real-time. In addition, the warning message in the digital label signal provides relevant warning information, whereby the server switches the corresponding operation mode according to the warning message to protect the fan and increase the life of the fan.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fan management system, comprising:
a fan comprising a driving circuit, wherein the driving circuit is configured for driving the fan, and the fan operates in an operation mode; and
a server connected to the fan and configured for controlling the operation of the fan;
wherein the driving circuit outputs a digital label signal when the fan operates abnormally, and the server obtains a production history, an operation information and a warning message of the fan through the digital label signal,
wherein the server adjusts the operation mode of the fan according to the warning message,
wherein the warning message of the fan comprises a life evaluation to the fan, the life evaluation comprises at least one of a voltage usage time of the fan, the real-time voltage and current value of the fan, the temperature detection to the fan, and the dust and foreign object detection to the fan,
wherein the driving circuit has a frequency generation pin, the frequency generation pin outputs the digital label signal when the fan operates abnormally, and the frequency generation pin continuously outputs a rotation speed signal when the fan operates normally.

2. The fan management system according to claim 1, wherein the life evaluation to the fan comprises utilizing a counter of the fan to record the voltage usage time of the fan, when the voltage usage time exceeds a preset time, the fan generates the warning message.

3. The fan management system according to claim 1, wherein the life evaluation to the fan comprises utilizing a temperature detection result of the fan by the thermal sensor, a rotation speed detection result of the fan by the rotation speed detection device, a Webber shape parameter, and a counter parameter to calculate a total residual life of the fan as the life evaluation of the fan, the fan generates the warning message when the total residual life of the fan is lower than a predetermined residual life.

4. The fan management system according to claim 1, wherein the production history comprises at least one of a production date, a production location, a production line information, a supplier, a supplier production number, a customer production number and a fan version of the fan.

5. The fan management system according to claim 1, wherein the operation information comprises at least one of a voltage, a current, a rotation speed, a temperature, an operation time and an error code of the fan.

6. The fan management system according to claim 1, wherein the driving circuit outputs the digital label signal to the server immediately when the fan is activated, or the driving circuit outputs the digital label signal to the server when the fan operates for a predetermined period of time after being activated.

7. The fan management system according to claim 6, wherein the driving circuit outputs the digital label signal to the server after the predetermined period of time when the server outputs a specific pulse width modulation signal to the driving circuit.

8. The fan management system according to claim 1, wherein when the server inputs an operation mode adjustment command to the fan to control the fan to operate in one of the first to fifth operation modes, the fan outputs a confirmation signal to the server to confirm receipt of the operating mode adjustment command and operate in the specified operating mode.

9. The fan management system according to claim 8, wherein when the server inputs an error signal to the fan, the fan outputs a repeated confirmation signal to the server to confirm the signal transmission of the server, and the fan continues to operate without adjusting the current operating mode.

10. A fan management system, comprising:
a fan comprising a driving circuit, wherein the driving circuit is configured for driving the fan, and the fan operates in an operation mode; and
a server connected to the fan and configured for controlling the operation of the fan;
wherein the driving circuit outputs a digital label signal when the fan operates abnormally, and the server obtains a production history, an operation information and a warning message of the fan through the digital label signal,
wherein the server adjusts the operation mode of the fan according to the warning message,
wherein the warning message of the fan comprises a life evaluation to the fan, the life evaluation comprises at least one of a voltage usage time of the fan, the real-time voltage and current value of the fan, the temperature detection to the fan, and the dust and foreign object detection to the fan,
wherein the driving circuit has a rotation detection pin, the rotation detection pin outputs a rotation detection signal and the digital label signal when the fan operates abnormally, and the rotation detection pin stops outputting the rotation detection signal and the digital label signal when the fan is restarted or operates normally.

11. The fan management system according to claim 10, wherein the life evaluation to the fan comprises utilizing a counter of the fan to record the voltage usage time of the fan, when the voltage usage time exceeds a preset time, the fan generates the warning message.

12. The fan management system according to claim 10, wherein the life evaluation to the fan comprises utilizing a temperature detection result of the fan by the thermal sensor, a rotation speed detection result of the fan by the rotation speed detection device, a Webber shape parameter, and a counter parameter to calculate a total residual life of the fan as the life evaluation of the fan, the fan generates the warning message when the total residual life of the fan is lower than a predetermined residual life.

13. The fan management system according to claim 10, wherein the production history comprises at least one of a production date, a production location, a production line information, a supplier, a supplier production number, a customer production number and a fan version of the fan.

14. The fan management system according to claim 10, wherein the operation information comprises at least one of a voltage, a current, a rotation speed, a temperature, an operation time and an error code of the fan.

15. The fan management system according to claim 10, wherein the driving circuit outputs the digital label signal to the server immediately when the fan is activated, or the driving circuit outputs the digital label signal to the server when the fan operates for a predetermined period of time after being activated.

16. The fan management system according to claim 15, wherein the driving circuit outputs the digital label signal to the server after the predetermined period of time when the server outputs a specific pulse width modulation signal to the driving circuit.

17. The fan management system according to claim 10, wherein when the server inputs an operation mode adjustment command to the fan to control the fan to operate in one of the first to fifth operation modes, the fan outputs a confirmation signal to the server to confirm receipt of the operating mode adjustment command and operate in the specified operating mode.

18. The fan management system according to claim 17, wherein when the server inputs an error signal to the fan, the fan outputs a repeated confirmation signal to the server to confirm the signal transmission of the server, and the fan continues to operate without adjusting the current operating mode.

* * * * *